United States Patent [19]

Oprysko et al.

[11] Patent Number: 4,727,234
[45] Date of Patent: Feb. 23, 1988

[54] LASER-BASED SYSTEM FOR THE TOTAL REPAIR OF PHOTOMASKS

[75] Inventors: Modest M. Oprysko, Manopac, N.Y.; Peter L. Young, Mercer Island, Wash.; Mark W. Beranek, Brown Deer, Wis.

[73] Assignee: Gould Inc., Rolling Meadows, Ill.

[21] Appl. No.: 879,751

[22] Filed: Jun. 27, 1986

Related U.S. Application Data

[63] Continuation-in-part of Ser. No. 622,368, Jun. 20, 1984, abandoned, and a continuation-in-part of Ser. No. 707,437, Mar. 1, 1985, abandoned.

[51] Int. Cl.$^4$ .............................................. B23K 26/00
[52] U.S. Cl. .............................. 219/121 L; 427/53.1; 427/140
[58] Field of Search .... 219/121 L, 121 LM, 121 LH, 219/121 LJ, 121 LA; 427/53.1, 140, 54.1

[56] References Cited

U.S. PATENT DOCUMENTS

| 4,324,854 | 4/1982 | Beauchamp et al. | 427/53.1 |
| 4,606,932 | 8/1986 | Oprysko et al. | 427/53.1 |
| 4,609,566 | 9/1986 | Hongo et al. | 427/53.1 |

*Primary Examiner*—C. L. Albritton

[57] ABSTRACT

An apparatus for repairing both clear and opaque defects in a photomask having a metal film pattern on a glass plate in which a visible laser light source is pulsed at selected frequencies to direct an optically focused laser beam into a gas sealed cell containing a mask. At one frequency, the laser pulses ablate opaque mask defects. At another frequency, and with the cell filled with a metal bearing gas, the laser beam causes thermal decomposition of the gas and deposition of metal to cure clear defects.

8 Claims, 7 Drawing Figures

LASER-BASED SYSTEM FOR THE TOTAL REPAIR OF PHOTOMASKS

This application is a continuation-in-part of U.S. Ser. No. 622,368, abandoned filed June 20, 1984 and U.S. Ser. No. 707,437, abandoned filed Mar. 1, 1985, both of which applications are incorporated herein by reference.

TECHNICAL FIELD

The present invention relates to a system for repairing both clear and opaque defects in photomasks.

BACKGROUND OF THE INVENTION

The process of fabricating photomasks (usually chrome or iron oxide on soda, lime, glass or quartz) typically leaves behind several defects. The defects can be classified as opaque or clear; the former relating to the case where excess chrome exists in an unwanted area, the latter relating to the case where chrome is missing from a desired area. These defects can also arise during use of the mask in standard lithographic processes.

A photomask used in integrated circuit production is a flat optical glass plate having an opaque pattern defined by a thin film of deposited metal, commonly chrome. A clear defect in such a mask is an area of glass that should have an opaque metal film but does not, and hence is clear. An opaque defect in a mask is an area of film on the glass where it should not be. Repairing mask defects has become more difficult as the scale to which masks are made has become smaller. Modern masks are made to definitions of 1 to 2 microns.

Currently, it is possible to repair opaque defects (i.e., remove excess chrome) by laser vaporization. The repair of clear defects is much more complex.

The conventional method of repairing clear defects relies on a lift-off process, i.e. spinning on photoresist, sputtering on a metal, followed by liftoff. This process is not only time consuming and expensive, but also runs the risk of introducing new defects since the entire photomask is affected. In addition, high resolution, e.g. the repair of a 2 m diameter pinhole, may be difficult to achieve.

Another more site-specific method exists. Here, a microdrop of ink is dispensed on the clear defect, and then the entire photomask is baked in an oven to promote adhesion. This process is of limited resolution. Defects less than 10 m square usually cannot be repaired. Furthermore, the repair is not durable—it is easily removed during standard photomask cleaning procedures.

Another site-specific method for defect repair employs an ultraviolet laser (typically at 257 nm). Here, the laser is used in conjunction with a metal-bearing gas. The laser light photo-dissociates (i.e., breaks the molecular bonds) the molecules in the vapor phase. The metal fragments subsequently impinge on the surface eventually forming a thin film.

This procedure is difficult to employ in the semiconductor industry. Ultraviolet lasers generally occupy an inordinate amount of space. Since clean room space, where the repair takes place, is limited and costly, such a repair system is undesirable. In addition, ultraviolet laser light particularly that generated at 257 nm, is unstable and unreliable in a production environment. The required ultraviolet optics is also difficult to obtain and costly.

In terms of laser-based systems for opaque defect repair, several problems are also encountered. For example, such systems depend on mechanical scanning stages for the positioning of the defect area under the laser irradiation zone. to avoid the large costs involved, manufacturers typically employ low-resolution stages—typically 10 $\mu$m for positioning. Finer adjustments must be made manually. This slows down the repair process and makes the accurate repair of small defects on the order of 1 m very difficult.

Further, such systems do not have the capability of scanning over small areas say 10 $\mu$m square. Thus, to remove excess chrome in such an area would require several individual laser repairs, i.e. the area in which chrome is to be removed would have to be brought under the laser irradiation zone in several discrete steps.

Apparatus is commercially available for repairing opaque mask defects by focusing laser light energy on the defect to vaporize and scatter the film molecules. Such apparatus using microscope optics has become quite automated, including computer control of the optical X-Y table and the laser source so that a mask can be scanned, the position of opaque defects noted and stored as compared to a proper mask pattern, and then placed in the apparatus for computer controlled positioning of the mask and operation of the laser to ablate the defects. By tightly focusing the laser through the optics of such an apparatus, high definition in correction is achieved.

To the present time, such apparatus cannot, with the same precision and control, correct clear defects in photomasks. However, a method has been developed offering precision and control in the use of a laser for curing clear defects—see U.S. Pat. No. 4,543,270 which is hereby incorporated by reference.

SUMMARY OF THE INVENTION

In accordance with the present invention, the disadvantages of prior photomask repair systems have been overcome. The system of the present invention is a low-power laser based system for repairing both clear and opaque defects in a photomask.

The system of the present invention includes a laser source for providing a beam having a wavelength between 0.40 $\mu$m and 2.0 $\mu$m, the power level of the laser source being less than or equal to 2 watts. The laser source is capable of continuous operation during the photomask repair process. An acousto-optical scanning device is provided to position and/or scan the laser beam across a predetermined area of the photomask so that small defects may be accurately repaired. Imaging-/focusing optics are coupled to the output of the scanning/positioning device to allow simultaneous viewing of the photomask and focusing of the laser beam on a predetermined area of the photomask. In addition, the system includes an acousto-optic modulator interfaced to a computer for the automatic control of the intensity and pulse duration of the laser beam in response to the power of the laser transmitted through the repair area as sensed by a detector. The computer is compatible with photomask inspection systems such as those manufactured by a commercially available photomask inspection system. Thus, information regarding the location of a photomask defect can be fed in from the commercially available photomask inspection system into the computer. The computer then drives a low resolution X-Y stage which will bring the defect into the optical field of view. The computer is then used to control the scanning/positioning device to accurately position the laser beam with respect to the defect on the photomask and/or to scan a predetermined area on the photomask. The computer-controlled positioning of the laser beam with respect to the defect is aided by a numbered grid which is superimposed on the monitor's image of the photomask.

It is an object of the present invention to embody in a single apparatus the ability to correct both clear and opaque photomask defects using a highly focused, high definition laser beam. A collateral object is to provide an apparatus of this kind which makes possible the creation of an autoamted apparatus for curing photomask defects.

Another object of the invention is to provide for an apparatus for the above type a cell for controlling the location and surrounding environment of a photomask under repair. A related object is to provide a cell as characterized above which permits visible light access to the photomask, for both viewing and laser repair, and allows the close positioning of the mask and the focusing optics required for high definition work. A further object is to provide a cell of the foregoing kind which is easy to sue and inexpensive to manufacture and maintain.

Additional objects, advantages, and novel features of the invention will be set forth in part in the description which follows, and will become apparent to those skilled in the art upon examination of the following or may be learned by practice of the invention.

The system may be employed to repair clear defects on a photomask by a method utilizing laser-induced degradation of a novalak-based polymer coating the photomask. In carrying out this method, the scanning device of the system scans the laser beam across the defective area of the photomask for localized heating thereof to darken the polymer coating the photomask. The surface power of the laser as sensed by the detector provides an indication of the darkening level of the polymer and in response thereto, the computer controls the power level of the laser beam to heat the polymer coating the photomask to a temperature between 200 degrees Celsius and 500 degrees Celsius so as to brown the polymer. When the detector indicates that the polymer has been adequately browned, the computer, in response thereto increase the power level of the laser beam to heat the polymer to a temperature which is greater than 500 degrees Celsius so as to char the polymer.

The system may also be employed to repair clear defects on a photomask by thermal deposition of micron-size metallic films. In order to carry out this method, a photomask is positioned in a gas cell containing a metal-bearing gaseous compound. A nucleation layer is formed on a surface of the photomask by shining ultraviolet light thereon. After the nucleation layer is formed, the system of the present invention is employed to focus the lower power laser beam on a defective surface of the photomask for localized heating of the area of the photomask to which the beam is incident to thermally decompose molecules of the metal-bearing gaseous compound on the heated area to deposit a metal film thereon.

These and other objects and advantages of the invention, as well as the details of an illustrated embodiment, will be more fully understood from the following description and the drawings.

DETAILED DESCRIPTION OF THE PREFERRED EMBODIMENTS

While the invention will be described in connection with preferred embodiments, it will be understood that we do not intend to limit the invention to that embodiment. On the contrary, we intend to cover all alternatives, modifications and equivalents as may be included within the spirit and scope of the invention as defined by the appended claims.

Figure 1:
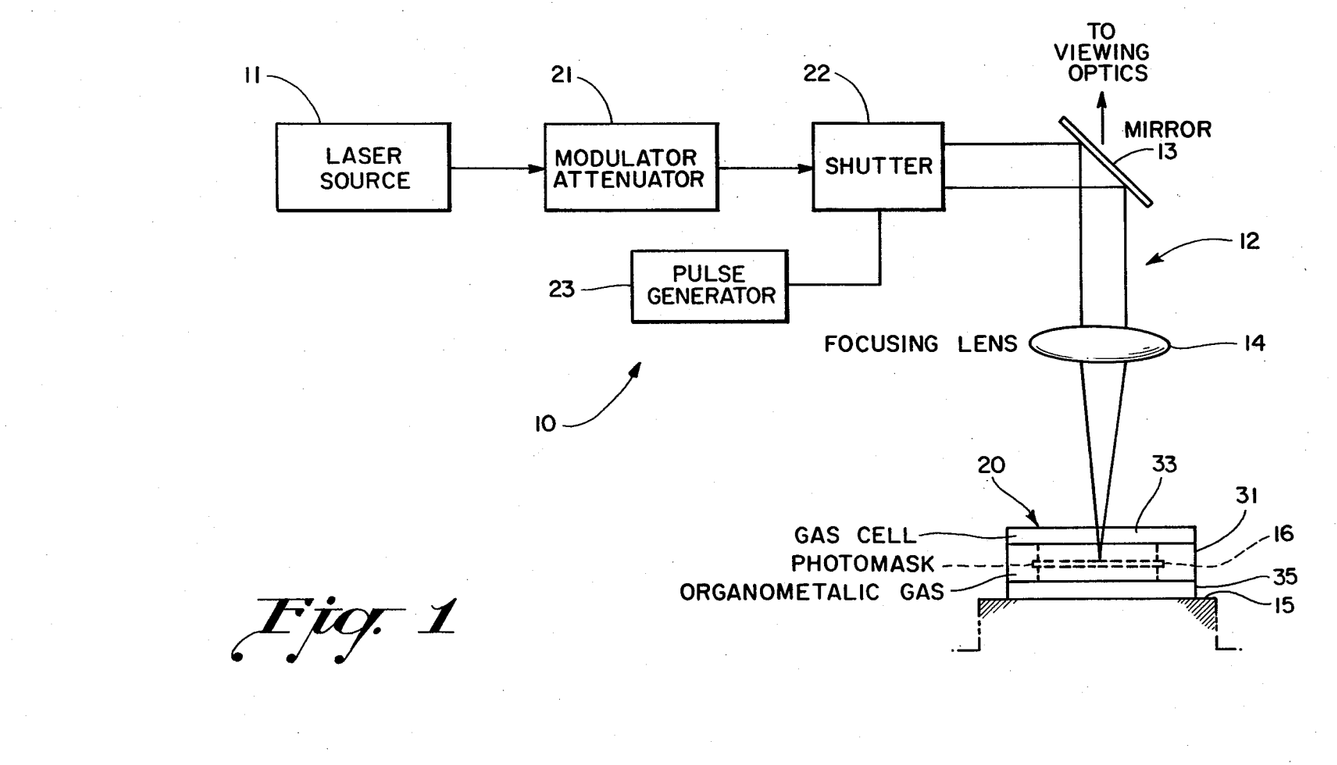
FIG. 1 is a schematic of an apparatus embodying the present invention.

Turning to the drawings, there is schematically shown in FIG. 1 an apparatus 10 embodying the invention and including a laser source 11 positioned to deliver laser light pulses to what is essentially a microscope 12 of which is shown a mirror 13, optics in the form of a focusing objective lens 14, and an X-Y table 15 underlying the optics. A photomask 16 being worked upon is supported within a closed cell 20 that is securely mounted on the table 15 and hence can be positioned relative to the focusing point of the optics by the usual movement of the table 15. As suggested by FIG. 1, microscope viewing optics are above the mirror permitting the photomask 16 to be inspected and visually positioned.

As disclosed in said U.S. Pat. No. 4,543,270, the laser source 11 should be selected to generate visible laser light having a wave length of from 0.4 to 2.0 microns. This permits the use of standard microscope optics. A laser delivering more than 10 kilowatts per square centimeter of power has been found suitable.

Figure 2:
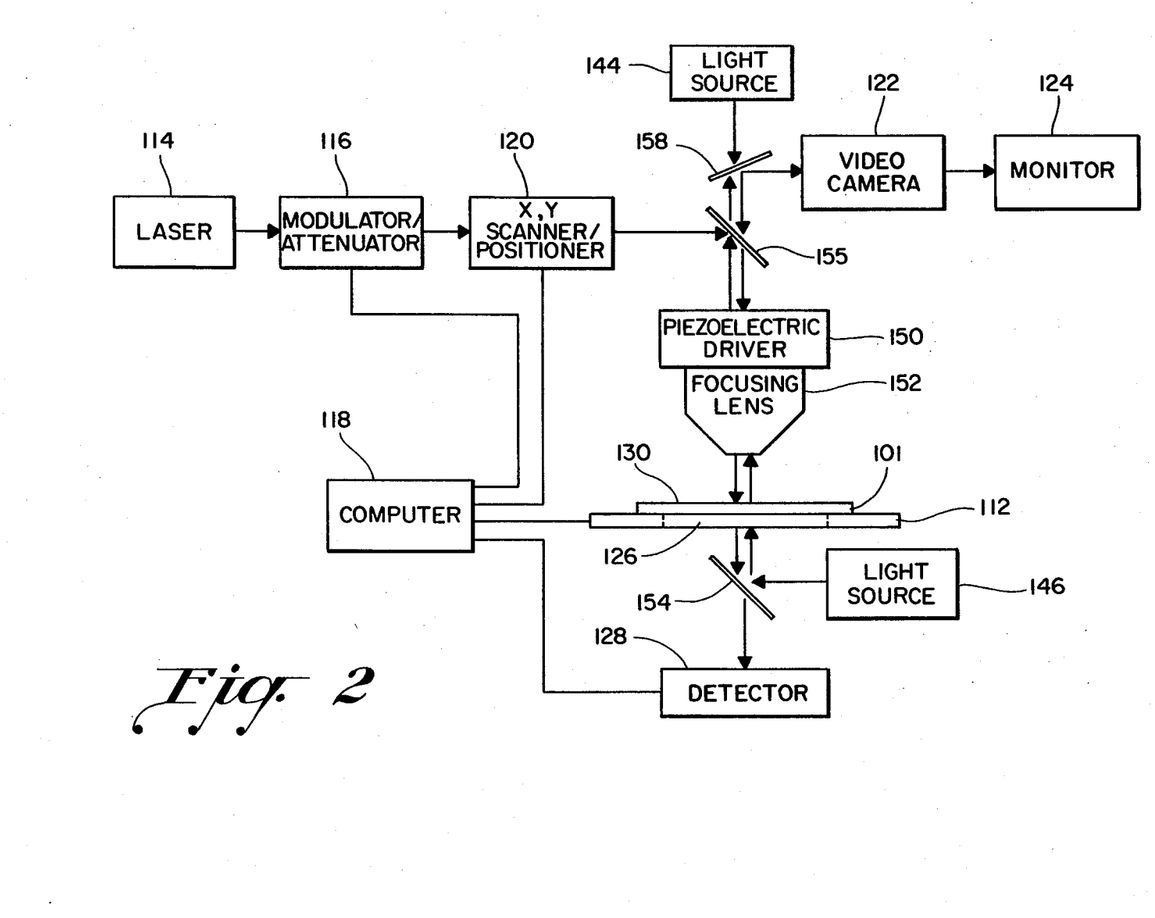
FIG. 2 is a block diagram of a second embodiment of the photomask repair system of the present invention.

Referring to FIG. 2, the system of the present invention repairs clear and opaque defects in a photomask 101 which is securely attached to a low-resolution X, Y scanning table 112. The table 112 also contains a low-resolution Z travel. The system employs a laser source 114, the power level of which is less than or equal to 2 watts, the beam having a wavelength between 0.40 $\mu$m and 2.0 $\mu$m. The laser source 114 may be a gas laser such as a HeNe or argon ion laser. A solid state laser source such as a GaAs or a GaAlAs laser can also be used having the property of being extremely compact.

The laser beam from the source 114 is directed into a modulator/attenuator 116. The modulator may be an acousto-optical modulator which is used to adjust the pulse duration of the laser beam in response to a control signal from a computer 118. The modulator is also used as a shutter capable of providing a single laser pulse of a predetermined duration. In the preferred embodiment, the shutter speed is adjusted between 1 $\mu$sec and 1 $\mu$sec. The attenuator adjusts the power level or intensity of the laser beam. The power level of the laser beam at the surface of the photomask can also be controlled by the attenuator, the attenuator varying the surface laser power between 0.01 milliwatts and 100 milliwatts. The modulator/attenuator 16 may be such as manufactured by Newport Electro-Optics and Intra Action, although other types of modulator/attenuators such as electro-optical may be suitable for use in the system of the present invention.

The beam output from the modulator/attenuator 116 is coupled to an X, Y scanning/positioning device 120 which may be an acousto-optical, electro-optical or mechanical scanning device capable of scanning and/or positioning the laser beam across a very small area such as a 128 $\mu m \times 128$ $\mu m$ area continuously or positioning the beam anywhere within this area. A suitable scanning/positioning device is also manufactured by Newport Electro-Optics and Intra Action. The laser beam output from the scanning device 120 is reflected into a high power focusing objective 152 via reflector 155. The objective focuses the beam to its diffraction-limited spot size. In the preferred embodiment, the objective has a numerical aperture of 0.2 or higher and a magnification of 20x or higher. The objective also facilitates the simultaneous viewing of the photomask by the operator. The photomask may be illuminated either by a set of reflected-light optics 114 or transmitted-light optics 146 which is directed through the photomask and objective via reflector 154. The sample and laser beam are simultaneously brought into focus by adjusting the Z (i.e., distance between photomask and objective) position of the mechanical stage 112. In addition, fine focusing is accomplished by the computer control of the piezoelectric driver 150 onto which the objective 152 is mounted. Sample viewing and laser beam positioning is facilitated by directing the light from the photomask via reflector 158 into video camera 122. The image of the photomask is then formed on monitor 124. The monitor 124 also has a numbered grid superimposed on it. This grid corresponds to an area of 128 $\mu m \times 128$ $\mu m$ on the photomask. Depending on the particular computer system used, a variety of grid sizes may be used. the grid size is chosen to be compatible with the bit-size of the computer.

The table 12 on which the photomask 101 is positioned may be transparent or may include an aperture 126 which allows the laser beam, transmitted through the photomask, to pass to a detector 128. The detector 128 is responsive to the beam transmitted thereto for sensing the amount of power at the surface of the photomask 101. The detector 128 provides a signal representing the surface laser power to the computer control 118 which in response thereto provides a control signal to the modulator/attenuator 116 to vary the intensity of the laser beam as described below.

The computer control 118 also controls the positioning of the laser beam with respect to the photomask 101. The computer control 118 may be compatible with the commercially available photomask inspection system which stores the location of the photomask defects. This data can then be used by computer 118 to control the mechanical movement of the table 112 in the X and Y directions in order to locate the defect approximately under the beam. Thus, data obtained independently by a photomask inspection system can be used to control the table 112. The mechanical movement of table 112 provides coarse positioning of the photomask with respect to the laser beam. The computer control 118 also controls the scanning/positioning device 120 to precisely locate the beam with respect to the photomask. The determination of the precise location on the photomask is aided by the numeric grid superimposed on the television monitor 124. The coordinates of the defect as obtained from the grid on the monitor 124 are then fed into the computer 118 which in turn controls the scanning/positioning device 120 which precisely locates the focused laser beam onto the defect area. The scanning device 120 under the control of the computer 118 thus provides fine adjustments in the positioning of the beam with respect to the photomask 101.

The system shown in FIG. 2 may be employed to carry out a method wherein clear defects on the photomask 101 are repaired by laser-induced degradation of a polymer coating the photomask. In order to carry out this method, the surface 130 of the photomask is coated with a novolak-based polymer, preferably a positive photoresist, to provide a coating layer having a thickness between 2,000Å and 20,000Å.

Other polymers may be used provided that they char or darken in response to heating; the polymer must also adhere satisfactorily when coated on the photomask. In addition, the polymer coating must be pinhole free. Furthermore, the uncharred region of the polymer must be capable of being removed easily without damaging the photomask. Another requirement of the particular polymer used by the subject method is that the charred region must have an optical density of at least 2.5 and be able to withstand the rigorous cleaning method normally encountered in photomask cleaning.

The coating procedures used are standard procedures and are well-known to those skilled in the art. Very basically, the polymer is sprayed on the photomask as the photomask is spun so that a relatively uniform coating results across the surface of the photomask. After coating the photomask 101 with the polymer, the photomask is positioned on the table 112, and the laser beam is scanned by the device 120 across the defective area of the photomask to heat the polymer coating to a temperature between 200 degrees Celsius and 500 degrees Celsius so as to brown the polymer. The detector 128 senses the power of the laser at the surface of the photomask to provide a signal representative thereof and of the power absorption of the photomask to provide an indication of the darkening level of the polymer. The computer in response to the signal output from the detector 128 determines when the polymer coating has been adequately browned by the laser beam and in response to such a determination varies the control signal applied to the modulator/attenuator 116 to increase the intensity of the laser beam so as to heat the polymer to a temperature which is greater than 500 degrees Celsius to further darken or char the polymer.

After the polymer is charred, that portion of the polymer which is not exposed to the laser is removed by immersing the photomask 10 in an organic solvent such as a ketone alcohol or inorganic solvent such as an alkali, and in the preferred embodiment, acetone is used as the solvent. The charred portion of the polymer has undergone a significant change in chemistry so that it is relatively insoluble with respect to the uncharred portion of the polymer. Although the mechanism by which the charred portion of the polymer becomes relatively insoluble is not completely understood, it is believed that the charred polymer has a much higher carbon ratio which, in turn, reduces its solubility. Further details of the method for providing laser-induced polymer degradation for photomask repair may be found in U.S. Pat. No. 4,592,975, which is incorporated herein by reference.

Figures 3, 4, 5:
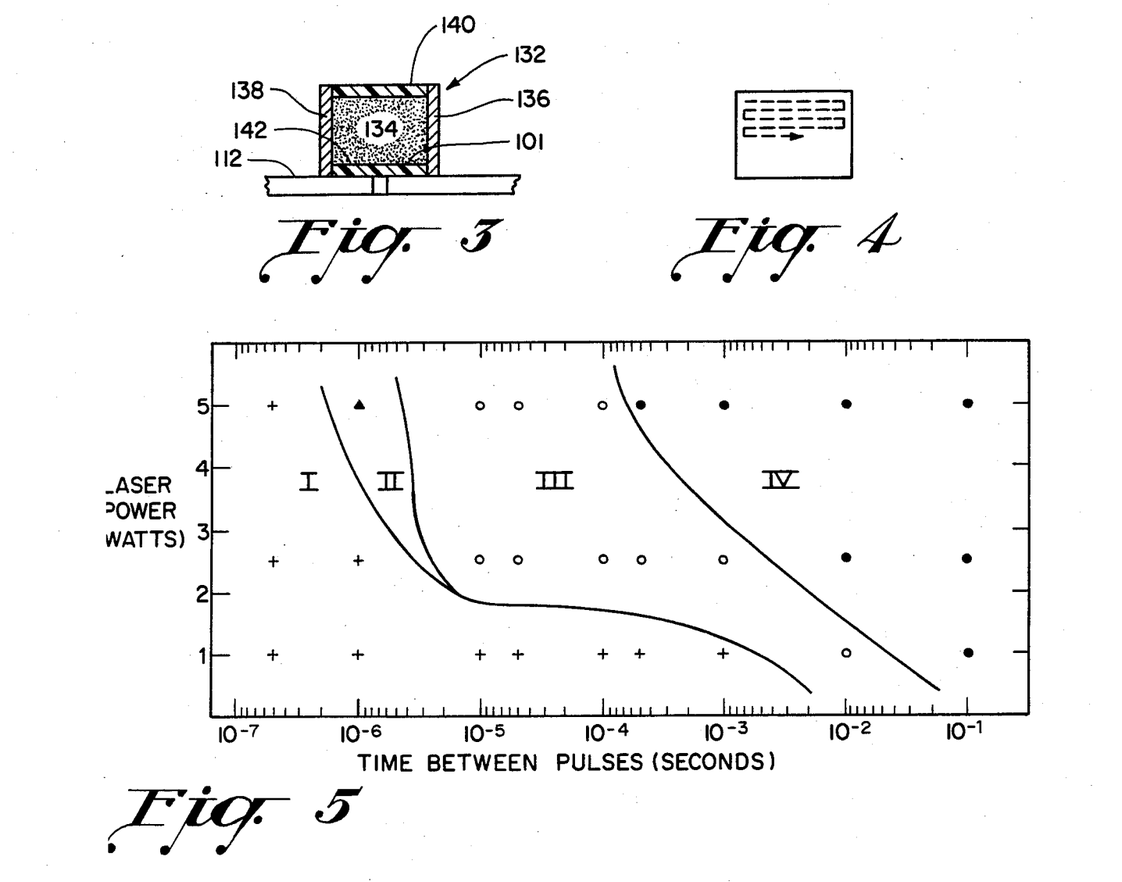
FIG. 3 is a cross-sectional view of a gas cell which may be used with the system of FIG. 2.
FIG. 4 is a representation of the path that the laser follows when scanning a clear or opaque defect
FIG. 5 is a chart showing expected phenomenon resulting from different modes of laser operation.

The system shown in FIG. 2 may also be employed to carry out a method of repairing clear defects in a photomask by thermal deposition of micronsize metallic films on the photomask. In order to carry out this method, the photomask 101 is positioned in a gas cell 132 (as shown in FIG. 3) which contains a metal-bearing gaseous compound 134. The gas cell 132 includes metal end plates 136 and 138 and a transparent window 140. The window 140 may, for example, be made of quartz. The photomask 101 may also form a window of the gas cell 132 with the surface 142 on which a metal deposit is to be made forming an inner surface of the cell.

After positioning the photomask 101 in the gas cell 132, a nucleation layer is formed on the photomask to seed the surface 142 thereof. The nucleation layer is a random deposit of parts of the gaseous compound 134 on the surface 142 of the photomask forming one or a few monolayers on the substrate surface which are substantially invisible and removable. The nucleation layer may be formed on the photomask 101 by shining ultraviolet light through the window 140 onto the surface 142 of the photomask 101 to randomly deposit parts of the metal-bearing compound 134 on the photomask.

After the nucleation layer is formed, the gas cell 132 is positioned on the table 112. The laser beam is then focused onto the defective surface on the photomask for localized heating of an area of the photomask to which the laser beam is incident to thermally decompose molecules of the gaseous compound 134 on the heated area to deposit a metal film thereon. Metal films are thermally deposited on the desired areas of the photomask by scanning the beam across these areas under the control of the scanning device 120. Details of the method for thermal deposition of micron-size metallic films on a photomask may be found in U.S. Pat. No. 4,543,270 which is incorporated herein by reference.

The system of FIG. 2 may also be employed to remove opaque defects from the photomask 101. In order to remove opaque defects (i.e., excess chrome), the computer 118 controls the modulator/attenuator 16 to adjust the power of the laser beam to a level which will remove the metal patterns from the surface of the photomask 101 as well known in the art. The scanning/positioning device 120 then scans the beam across the defective area of the photomask to remove any unwanted metal deposits. The scanning/positioning device 120 can also be used to select a single 1 μm area of the photomask for removal of chrome. The system of FIG. 2 represents an improvement over prior-art opaque-defect repair systems for the following reasons. First, the system described herein causes the laser to be scanned in response to commands by computer across the opaque defect in a continuous-path rather than normally moved across the defect in discreet steps. Second, in prior art systems, the photomask is moved in discreet steps with respect to the laser rather than moving the laser in a continuous path with respect to the photomask as taught by the subject invention. By scanning the laser with respect to the photomask, the speed of the process can be greatly increased. In the system taught by the present invention the opaque defect area is divided into rectangular sections, and the coordinates of each corner of each rectangle is determined from the grid on the monitor and then fed into the computer. The computer then causes the laser to be automatically scanned in a boustrophedonic path until the entire area of the rectangle has been covered. This removes all of the metal within that rectangle. The same process is then repeated for each rectangular area until the entire opaque defect is repaired. The path that the laser follows is illustrated in FIG. 4.

The scanning process used by the laser is similar when the laser is used to repair clear defects. Both opaque and clear defects can be repaired in one processing sequence. This can be accomplished in one of two ways. One way to accomplish both clear and opaque defect repair in a single process is to coat the photomask with the novolak-based polymer. Next, darken the polymer over the clear defects. Then, ablate the polymer over the opaque defects, followed by vaporizing the metalization forming the opaque defects. Another way to repair both clear and opaque defects in a single process is to place the photomask in a cell containing a metal-bearing gaseous compound. Next, the laser beam is focused on the clear defect to deposit metal over the clear defect area. Then, the cell is vented to removed the metal-bearing gaseous compound. The laser is then focused on the opaque defect to vaporize the metal forming the opaque defect.

In carrying out the invention, laser light is delivered to the photomask as a focused timed pulse at a selected frequency. The frequency can vary, depending on the effect desired, from a single pulse to a train of pulses at well over 100 Hz. Referring again to FIG. 1, delivered laser power is controlled by a modulator/attenuator 21, and pulse duration and frequency is controlled by a shutter 22 driven by a pulse generator 23. Typically, pulses from one microsecond up to one second are used. The chart of FIG. 5 shows the effect of 400 nsec pulses at laser powers in the range of 1 to 5 watts, the scale on the vertical axis. Pulse frequencies are more than 100 Hz and vary from 0.1 of a second between pulses, at the right of the horizontal axis scale of the FIG. 4 chart, to less than a millionth of a second between pulses, the value at the left of the horizontal chart scale. By varying the frequency of the short pulses, through the control of the pulse generator 23, different effects on the photomask are achieved. This is displayed by the FIG. 4 chart in the form of regions 1 through 4. A discussion of these effects will follow.

Figure 6:
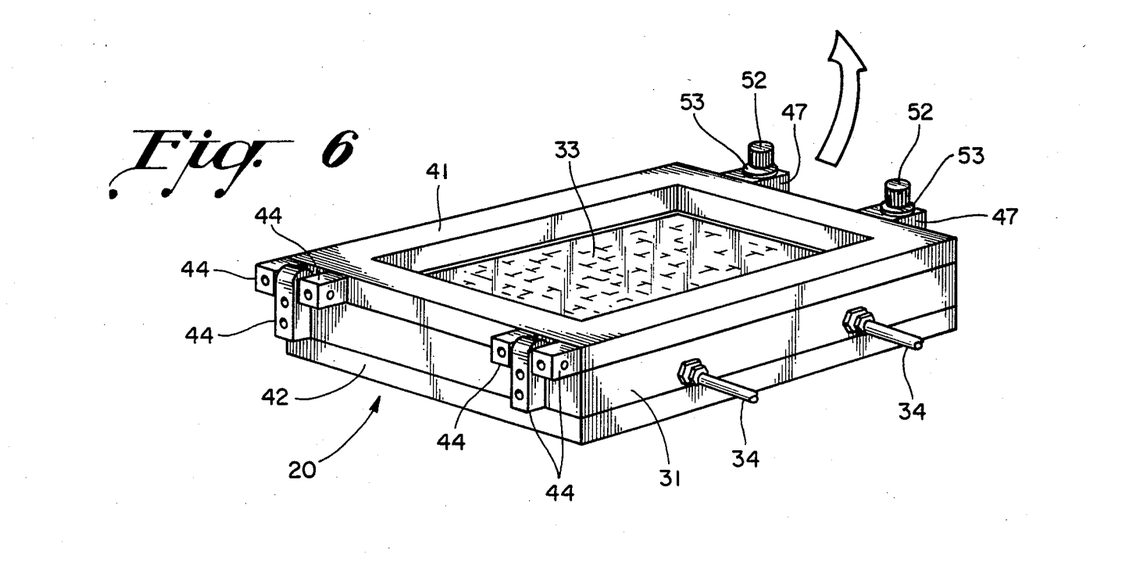
FIG. 6 is a perspective of a cell used in the apparatus of FIG. 1.
Figure 7:
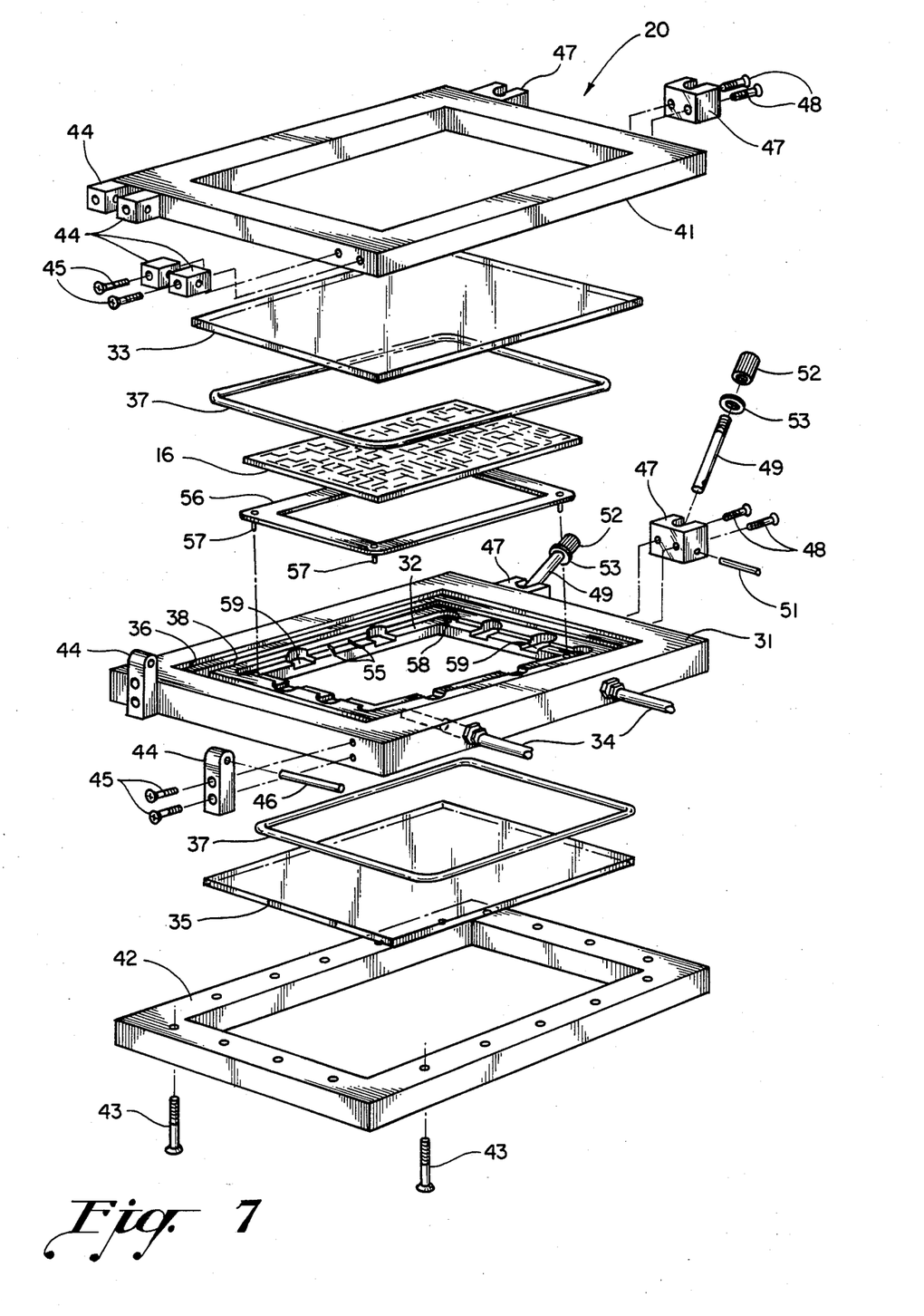
FIG. 7 is an exploded perspective of the cell shown in FIG. 6.

Pursuant to the invention, the cell 20 includes a flat frame 31 having a recess 32 for receiving the photomask 16, a glass cover 33 for closing and sealing a mask in the frame with the mask and the cover being closely spaced and a pair of lines 34 for gas-charging the cell and surrounding the mask with a metal bearing gas. The close spacing of the cover 33 and the upper surface of the photomask 16 permits the required short distance between the optics of the microscope 12 and the metal film pattern on the mask so that the laser light can be focused with precision. A working distance of under 10 millimeters is desirable.

The lines 34 permit the practice of the method disclosed in U.S. Pat. No. 4,543,270 wherein the cell is charged with an organometallic gas and the sharply focused laser light causes thermal deposition of metal from the gas on precisely located areas of the mask, thus correcting so-called clear defects. In more detail, the laser beam is first focused of the edge of existing chrome film on the mask just adjacent the clear defect to be rendered opaque. The laser energy scatters molecules of chrome over the adjacent area to form a still transparent nucleation layer. The laser is then focused on the defect area, which might be only one or two microns in length or width, and the area is heated by the laser energy to the point that the gas in contact with that area is thermally decomposed and a film of metal from the gas is deposited. The film is opaque and thus constitutes the correction for the clear defect.

In the preferred embodiment, the bottom of the frame 31 is sealed by a second glass cover 35, the covers 33, 35 are positioned in shallow frame recesses 36, only one of which is shown, and the covers and frame 31 are sealed by O-rings fitted in from grooves 38, only one of which is shown. The covers 33, 35 are pressed against the top and bottom of the frame 31 by open centered plates 41 and 42, respectively, which are secured to the frame. The recesses 36 have a depth equalling the thickness of the covers 33, 35 so that the covers can be pressed against the frame, and this compresses the O-rings 37 into the grooves 38 a predetermined amount to produce a uniform and reliable gas seal.

The plate 42 is secured to the frame by a plurality of screws 43. The plate 41 is latched against the frame so that it can be lifted to release the cover 33 and provide access to the photomask 16. In the illustrated embodiment, one side of the plate 41 is hinged to the frame by hinge members 44 secured by screws 45 and connected by pins 46. On the other side, notched latch blocks 47 are secured to the plate 41 and the frame 31 screws 48. Rods 49 are pivoted by pins 51 in one set of latch blocks 47, and the rods threadably carry heads 52 positioned above washers 53. It can be readily seen that the plate 41 can be swung to and from the frame 31 and that, when the plate is on the frame, the rods 49 can be lifted to extend through the notches of overlying blocks 47, and then the heads 52 can be tightened against the washers 53 to securely and firmly hold the plate 41 against the frame 31.

Preferably, the covers 33, 35 are formed of optical quality glass of the kind used to make photomasks. With both the top and bottom of the cell 20 being transparent, the mask in the cell can be viewed either by reflected or transmitted light. The lower plate 42 may be locked to the X-Y table 15 of the microscope in any suitable manner. To establish a fixed relationship between a photomask and the cell 20, and thus between the photomask and the X-Y table 15 since the cell is locked to the table, springs 55 are mounted in the recess 32 so as to bias the photomask 16 into a fixed position relative to the frame 31.

Photomasks may vary in thickness, typically being from 0.06 to 0.15 of an inch thick. To keep the film pattern side of a mask close to the cover 33 regardless of the mask thickness, one or more spacers 56 of varying thickness are provided to fit in the recess 32 beneath a photomask. The spacers are held in position by corner pins 57 that fit in locating holes 58 in the frame recess 32. Spacers 56 of appropriate thickness are selected to match the thickness of the photomask being repaired so as to keep the top of the mask close to the cover 33.

To insure that gas introduced into the cell flows to both sides of the mask, a plurality of notches 59 are formed in the frame 31 so as to extend through the recess 32. The notches 59 thus form passages around the edges of a photomask resting in the recess 32 and gas can easily flow to both sides of the mask and completely fill, or to completely evacuate, the cell. It will be apparent that the pair of lines 34 readily permits the cell 20 to be either charged or purged with appropriate gas valved to the lines.

The repair of clear mask defects through the thermal decomposition and deposition of metal has been referred to above. Opaque defects can be corrected in the usual fashion by directing the focused laser beam onto the undesired chrome film and vaporizing the defect. Present equipment typically uses a single high power laser pulse of short duration for this purpose, such as a 10 nanosecond pulse having a 100 watt peak power. This is substantially different, and requires a substantially different laser setting achievable with the apparatus 10, from what is typically required for depositing metal as discussed above. In that case, a lower power, long duration pulse is called for, such as a 10 milliwatt pulse 20 milliseconds long when the cell contains a vapor pressure of 12 Torr of $Al(CH_3)_3$ gas.

It has also been found that both clear and opaque defects can be corrected with the photomask supported in the metal bearing gas environment of the cell 20 by varying the frequency of the laser pulses. Returning to the chart of FIG. 5, if the pulse power and frequency is in the region numbered 4, the effect of the pulses at the point of focus is to ablate the existing chrome film—which would be the correction of opaque defects. If the pulse power and frequency is in the region numbered 1, the rapidity of the pulses generates sufficient heat at the point of focus that thermal decomposition takes place and metal from the gas is deposited—which is the correction of clear defects. Regions 2 and 3 produce intermediate or combined effects. In region 3, the ablation of the existing metal occurred followed, if the pulsing continued, by the deposition of metal. In region 2, the effect was to deposit metal but, at the very center of the focused beam, to vaporize or ablate the metal so as to produce a small hole at the center of focus.

Yet another process can be performed efficiently by the apparatus 10 to correct photomasks, and that is the correction of clear defects by photoresist darkening. A process utilizing laser radiation for that purpose is disclosed in U.S. Pat. No. 4,592,975 hereby incorporated by reference. Basically, the process involves coating the area to be corrected with an appropriate polymer and utilizing a focused laser beam to char and darken the desired area of the coating so that the charred area will resist subsequent washing in a solvent effective to remove the remaining coating. It will be apparent that the apparatus 10 with its provision for precisely locating a focused laser beam of controlled energy is well suited to perform that method. In this case, no enclosed cell is required and the cell 20 can be either used as an open fixture or some other fixture can hold the photomask.

The obvious advantage of the apparatus 10 is to permit the correction of both clear and opaque defects in a photomask using a single apparatus. Beyond this, those skilled in the art will understand that the apparatus 10 corresponds in large part to existing apparatus for dealing with opaque defects that is highly automated and computer controlled. The principles involved in automatically scanning and storing photomask defects for removing opaque defects can be easily extended to noting clear defects as well and, using the controls and structure described above, correcting those defects. It is therefore possible to scan a photomask once for both clear and opaque defects, and to process that mask once with the laser power and/or pulse frequency being appropriately controlled to correct all defects in that one pass.

The sealed cell 20 is obviously critical to the practice of the invention, and it will be apparent that the cell 20 is of straightforward economical design that is easy to handle and maintain.

Although the invention has been described and illustrated in detail, it is to be clearly understood that the same is by way of illustration and example only, and is not to be taken by way of limitation; the spirit and scope of this invention being limited only by the terms of the appended claims.

We claim:

1. A system for repairing clear and opaque defects in photomasks comprising:
   a cell for enclosing a photomask;
   a laser source for providing a low power laser light beam;
   means for focusing said laser light beam onto the photomask;
   means for positioning said laser light beam and said photomask relative to one another so as to vary the point of focus of the light beam on the photomask; and
   means for causing said laser source to emit laser light pulses of selected power and duration and at selectable frequency including a single pulse.

2. The system of claim 1 wherein said laser source provides laser light having a wavelength of from 0.4 to 2 microns.

3. The system of claim 1 further comprising means for supplying a metal bearing gas into said cell.

4. The system of claim 1 wherein said cell includes a flat frame having a recess for receiving a photomask, and a glass cover for closing and sealing a mask in said frame with the mask and cover being closely spaced.

5. The system of claim 1 wherein said cell comprises a flat frame having a recess for receiving and supporting a glass photomask, a glass cover sealed to said frame over and closely spaced from said recess, means for sealing the bottom of said frame so that a photomask in said recess is completely enclosed in a sealed region while remaining visible through said glass cover, and means for delivering or removing selected gases from said sealed region.

6. The combination of claim 5 in which said means for sealing is a second glass cover, said covers being pressed against the top and bottom of said frame by open centered plates, said frame having O-ring grooves and O rings in the grooves to provide gas tight seals between said covers and the frame.

7. The combination of claim 6 in which the upper one of said plates is latched against said frame so that it can be lifted to release the glass cover and provide access to a photomask in said recess.

8. The combination of claim 5 in which said frame has notches extending through said recess so that gas on one side of the photomask set in said recess can easily flow to the other side of the mask.

* * * * *